US011552130B2

(12) United States Patent
Nakamura et al.

(10) Patent No.: US 11,552,130 B2
(45) Date of Patent: Jan. 10, 2023

(54) DISPLAY DEVICE INCLUDING PLURALITY OF SUB-PIXELS ADJACENT TO ONE ANOTHER IN DIAGONAL DIRECTION

(71) Applicant: Sharp Kabushiki Kaisha, Sakai (JP)

(72) Inventors: Kohzoh Nakamura, Sakai (JP); Tamotsu Sakai, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 100 days.

(21) Appl. No.: 16/634,895

(22) PCT Filed: Jul. 31, 2017

(86) PCT No.: PCT/JP2017/027697
§ 371 (c)(1),
(2) Date: Jan. 29, 2020

(87) PCT Pub. No.: WO2019/026132
PCT Pub. Date: Feb. 7, 2019

(65) Prior Publication Data
US 2020/0235174 A1 Jul. 23, 2020

(51) Int. Cl.
*H01L 27/32* (2006.01)

(52) U.S. Cl.
CPC ...... *H01L 27/3218* (2013.01); *H01L 27/3216* (2013.01); *H01L 27/3276* (2013.01)

(58) Field of Classification Search
CPC ............. H01L 27/3218; H01L 27/3216; H01L 27/3276

(Continued)

(56) References Cited

U.S. PATENT DOCUMENTS

2005/0168678 A1 8/2005 Andou et al.
2008/0001525 A1* 1/2008 Chao .................. H01L 27/3218 313/503

(Continued)

FOREIGN PATENT DOCUMENTS

CN 104576696 A 4/2015
JP 2005-221682 A 8/2005

(Continued)

OTHER PUBLICATIONS

Official Communication issued in International Patent Application No. PCT/JP2017/027697, dated Oct. 10, 2017.

*Primary Examiner* — Thao X Le
*Assistant Examiner* — Eric W Jones
(74) *Attorney, Agent, or Firm* — Keating & Bennett, LLP

(57) ABSTRACT

A display device includes a first subpixel including a light-emitting layer of a first color, a second subpixel adjacent to the first subpixel in a row direction or a column direction, the second subpixel including a light-emitting layer of a second color, and a third subpixel adjacent to the first subpixel and the second subpixel in a diagonal direction, the third subpixel including a light-emitting layer of a third color, wherein the first subpixel to the third subpixel include light-emitting regions that are geometrically similar to one another, the light-emitting regions of two of the first subpixel to the third subpixel are in the same size, and a light-emitting region of remaining one of the first subpixel to the third subpixel is larger than the light-emitting regions of the two of the first subpixel to the third subpixel.

17 Claims, 7 Drawing Sheets

(58) Field of Classification Search
USPC .................................................... 257/40, 59
See application file for complete search history.

(56) References Cited

U.S. PATENT DOCUMENTS

| | | | | |
|---|---|---|---|---|
| 2010/0253222 | A1* | 10/2010 | Koshihara | H01L 51/5265 315/32 |
| 2013/0002118 | A1* | 1/2013 | Ko | G09G 3/3208 313/1 |
| 2015/0015466 | A1 | 1/2015 | Feng | |
| 2015/0015600 | A1* | 1/2015 | Yang | G09G 3/2003 345/600 |
| 2015/0162391 | A1 | 6/2015 | Kim | |
| 2016/0240590 | A1* | 8/2016 | Liu | H01L 51/502 |
| 2016/0253943 | A1 | 9/2016 | Wang | |
| 2017/0124953 | A1 | 5/2017 | Shim | |
| 2017/0309688 | A1 | 10/2017 | Lee et al. | |
| 2018/0261654 | A1* | 9/2018 | Hwang | H01L 51/5036 |

FOREIGN PATENT DOCUMENTS

| | | | |
|---|---|---|---|
| JP | 2005-345766 | A | 12/2005 |
| JP | 2015-018242 | A | 1/2015 |
| JP | 2016-001294 | A | 1/2016 |
| KR | 10-1700558 | B1 | 1/2017 |

* cited by examiner

DISPLAY DEVICE INCLUDING PLURALITY OF SUB-PIXELS ADJACENT TO ONE ANOTHER IN DIAGONAL DIRECTION

TECHNICAL FIELD

The present disclosure relates to a display device.

BACKGROUND ART

PTL 1 discloses an organic EL display in which red, blue, and green subpixels are provided with delta arrangement.

CITATION LIST

Patent Literature

PTL 1: JP 2016-1294 A (published on Jan. 7, 2016)

SUMMARY

Technical Problem

The configuration of PTL 1 has a problem in that color mixing due to defective vapor deposition is likely to be caused in a case where a resolution is increased.

Solution to Problem

A display device according to one aspect of the disclosure includes: a first subpixel including a light-emitting layer of a first color; a second subpixel adjacent to the first subpixel in a row direction or a column direction, the second subpixel including a light-emitting layer of a second color; and a third subpixel adjacent to the first subpixel and the second subpixel in a diagonal direction, the third subpixel including a light-emitting layer of a third color, wherein the first subpixel to the third subpixel include light-emitting regions that are geometrically similar to one another, the light-emitting regions of two of the first subpixel to the third subpixel are in the same size, and a light-emitting region of remaining one of the first subpixel to the third subpixel is larger than the light-emitting regions of the two of the first subpixel to the third subpixel. Note that the row direction and the column direction are two directions perpendicular to each other, and the diagonal direction is set with the two directions as references.

Advantageous Effects of Disclosure

According to the one aspect of the disclosure, color mixing is not likely to be caused even in a case where a resolution is increased.

DESCRIPTION OF EMBODIMENTS

Figure 1:
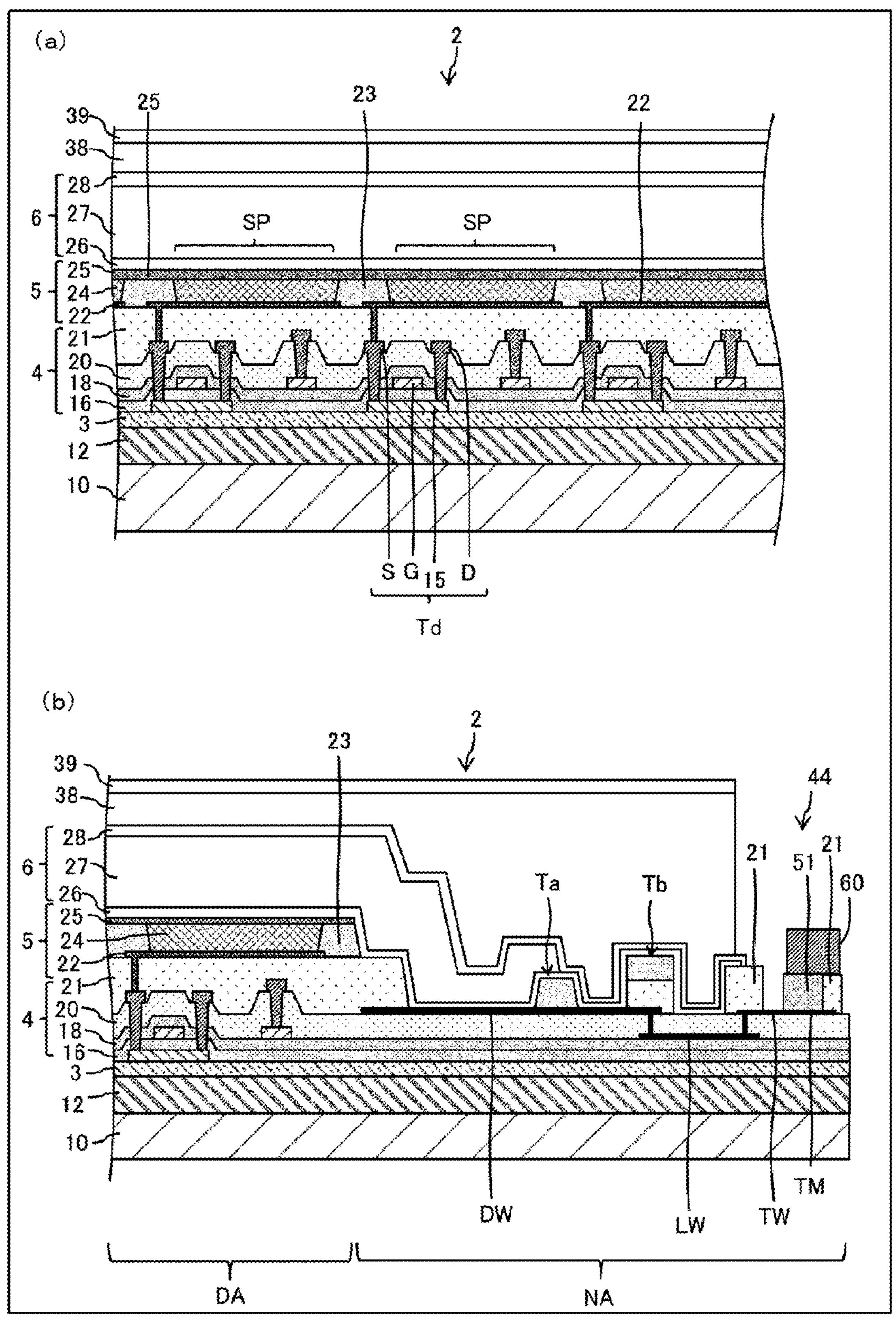
FIG. 1 is a cross-sectional view illustrating a configuration example of a display device.

FIG. 1 is a cross-sectional view illustrating a configuration example of a display device. A display device 2 of FIG. 1 is a top-emitting type that emits light upward, and includes a base material 10, a resin layer 12, a barrier layer 3 (undercoat layer), a thin-film transistor (TFT) layer 4, a light-emitting element layer 5, a sealing layer 6, an adhesive layer 38, and a function film 39, in that order from a lower side.

Examples of the material of the resin layer 12 include polyimide, epoxy, and polyamide. Examples of the material of the base material 10 include polyethylene terephthalate (PET).

The barrier layer 3 is a layer that inhibits moisture or impurities from reaching the TFT layer 4 or the light-emitting element layer 5 when the display device is being used, and can be constituted by a silicon oxide film, a silicon nitride film, or a silicon oxynitride film, or by a layered film of these, for example, formed using chemical vapor deposition (CVD).

The TFT layer 4 includes a semiconductor film 15, an inorganic insulating film 16 formed in a layer above the semiconductor film 15, a gate electrode G formed in a layer above the inorganic insulating film 16, an inorganic insulating film 18 formed in a layer above the gate electrode G, a capacitance wiring line C formed in a layer above the inorganic insulating film 18, an inorganic insulating film 20 formed in a layer above the capacitance wiring line C, a source electrode S and a drain electrode D both formed in a layer above the inorganic insulating film 20, and a flattening film 21 formed in a layer above the source electrode S and the drain electrode D.

A thin-film transistor Td (light emission control transistor) is configured to include the semiconductor film 15, the inorganic insulating film 16 (the gate insulating film), and the gate electrode G. The source electrode S is connected to a source region of the semiconductor film 15, and the drain electrode D is connected to a drain region of the semiconductor film 15.

The semiconductor film 15 is formed of low-temperature polysilicon (LTPS) or an oxide semiconductor, for example. Note that, although the TFT provided with the semiconductor film 15 as the channel is illustrated as having a top gate structure in FIG. 2, the TFT may have a bottom gate structure (when the TFT channel is an oxide semiconductor, for example).

The inorganic insulating films 16, 18, and 20 can be constituted, for example, by a silicon oxide (SiOx) film or a silicon nitride (SiNx) film, or a layered film of these, formed using CVD. The flattering film (interlayer insulating film) 21 can be constituted, for example, by a coatable photosensitive organic material, such as a polyimide, an acrylic, or the like.

The gate electrode G, the source electrode S, the drain electrode D, and the terminal are formed of a metal single layer film or a layered film including, for example, at least one of aluminum (Al), tungsten (W), molybdenum (Mo), tantalum (Ta), chromium (Cr), titanium (Ti), and copper (Cu).

The terminal portion 44 is provided on an end portion (a non-active area NA that does not overlap with the light-emitting element layer 5) of the TFT layer 4. The terminal portion 44 includes a terminal TM that is used for connecting with an IC chip or the electronic circuit board 60 such as an FPC and a terminal wiring line TW that is connected to the terminal TM. The terminal wiring line TW is electrically connected to various wiring lines of the TFT layer 4 with a relay wiring line LW and a lead-out wiring line DW therebetween.

The terminal TM, the terminal wiring line TW, and the lead-out wiring line DW are formed in the same process as that of the source electrode S, for example, and thus, are formed in the same layer (on the inorganic insulating film 20) and of the same material (two layers of titanium film and an aluminum film sandwiched between the two layers of titanium film, for example) as those of the source electrode S. The relay wiring line LW is formed in the same process as that of the capacitance electrode C, for example. End faces (edges) of the terminal TM, the terminal wiring line TW, and the lead-out wiring line DW are covered by the flattening film 21.

The light-emitting element layer 5 (an organic light-emitting diode layer, for example) includes an anode electrode 22 formed in a layer above the flattening film 21, a bank 23 that defines a subpixel of an active area DA (a region that overlaps with the light-emitting element layer 5), a light-emitting layer 24 formed in a layer above the anode electrode 22, and a cathode electrode 25 formed in a layer above the EL layer 24, and a light-emitting element (an organic light-emitting diode (OLED), for example) is configured to include the anode electrode 22, the light-emitting layer 24, and the cathode electrode 25.

The bank 23 covers an edge of the anode electrode 22, and the light-emitting layer 24 is formed in a region (a light-emitting region) surrounded by the bank 23, using vapor deposition or an ink-jet method. In a case where the light-emitting element layer 5 is an organic light-emitting diode (OLED) layer, for example, a hole injection layer, a hole transport layer, the light-emitting layer 24, an electron transport layer, and an electron injection layer are layered above a bottom surface of the bank (a part where the anode electrode 22 is exposed). Here, the layers aside from the light-emitting layer 24 can be common layers.

The anode electrode (anode electrode) 22 is formed by layering Indium Tin Oxide (ITO) and an alloy containing Ag, for example, and has light reflectivity (to be described below in more detail). The cathode electrode 25 can be constituted by a light-transmissive conductive material such as Indium Tin Oxide (ITO) and Indium Zinc Oxide (IZO).

If the light-emitting element layer 5 is an OLED layer, positive holes and electrons recombine inside the light-emitting layer 24 in response to a drive current between the anode electrode 22 and the cathode electrode 25, and light is emitted as a result of excitons, which are generated by the recombination, falling into a ground state. Since the cathode electrode 25 is translucent and the anode electrode 22 is light-reflective, the light emitted from the light-emitting layer 24 travels upwards and results in top emission.

The light-emitting element layer 5 may be used not only in a case of constituting the OLED element, but also in a case of constituting an inorganic light-emitting diode or a quantum dot light-emitting diode.

A bulging body Ta and a bulging body Tb that define edges of the organic sealing film 27 are formed in the non-active area NA. The bulging body Ta functions as a liquid stopper when the organic sealing film 27 is applied using an ink-jet method, and the bulging body Tb functions as a backup liquid stopper. Note that a lower portion of the bulging body Tb is configured by the flattening film 21, and functions as a protection film for an end face of the lead-out wiring line DW. The bank 23, the bulging body Ta, and an upper portion of the bulging body Tb can be formed in the same process, for example, by using a coatable photosensitive organic material such as a polyimide, an epoxy, or an acrylic.

The sealing layer 6 is light-transmissive, and includes the inorganic sealing film 26 that covers the cathode electrode 25, an organic sealing film 27 formed in a layer above the inorganic sealing film 26, and an inorganic sealing film 28 that covers the organic sealing film 27. The inorganic sealing films 26, 28 may be made of a silicon oxide film, a silicon nitride film, a silicon oxynitride film, or a layered film of these, formed by CVD using a mask, for example. The organic sealing film 27 is thicker than the inorganic sealing films 26 and 28, is a translucent organic film, and can be fabricated from a coatable photosensitive organic material such as a polyimide or an acrylic. For example, after coating the inorganic sealing film 26 with an ink containing such an organic material using an ink-jet method, the ink is cured by UV irradiation. The sealing layer 6 covers the light-emitting element layer 5 and inhibits foreign matter, such as water and oxygen, from infiltrating to the light-emitting element layer 5.

The function film 39 has an optical compensation function, a touch sensor function, a protection function, or the like, for example. The electronic circuit board 60 is an IC chip or a flexible printed circuit board (FPC) that is mounted on the terminal TM through intermediation of an anisotropic conductive material 51, for example.

Figure 2:
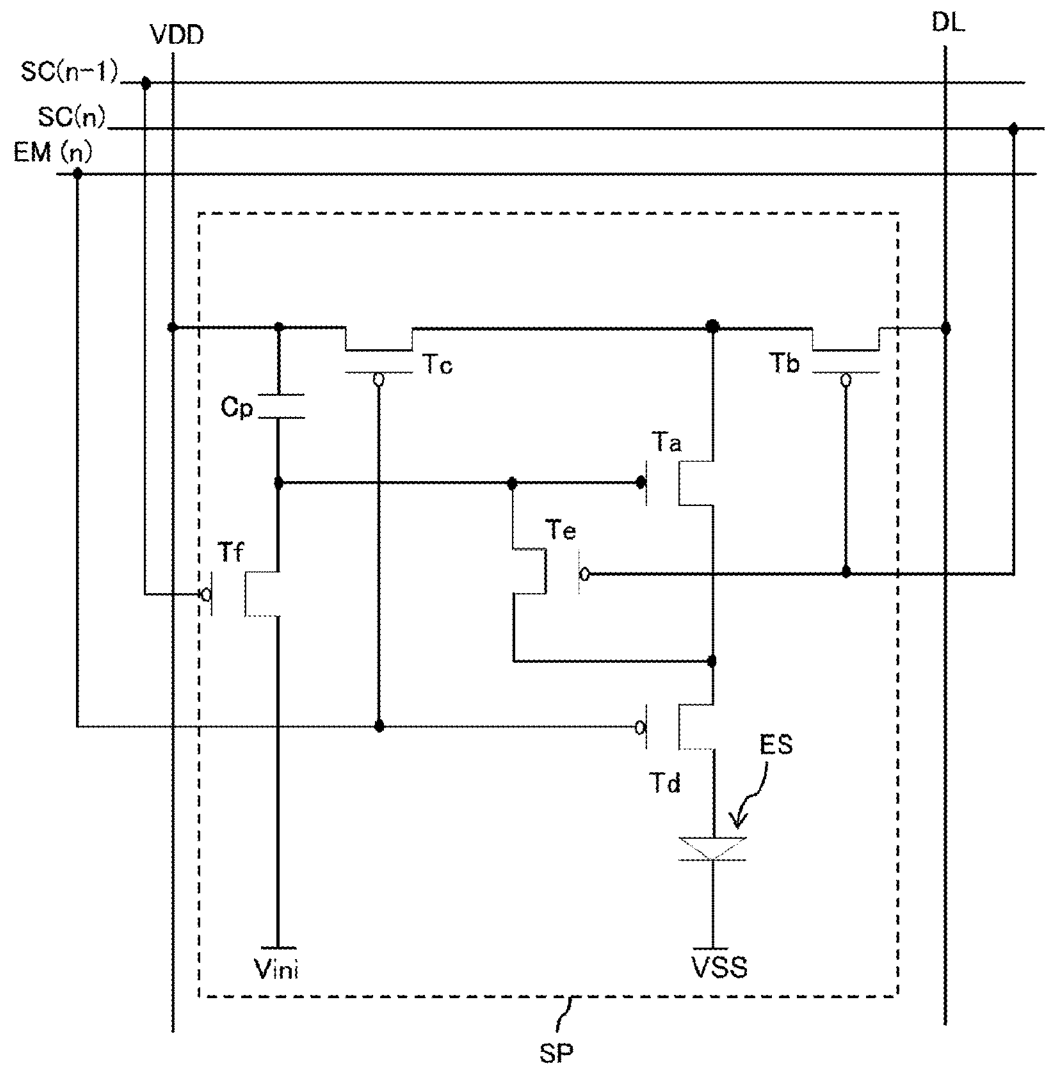
FIG. 2 is a circuit diagram illustrating a configuration example of a subpixel.

FIG. 2 is a circuit diagram illustrating a configuration example of a subpixel. The TFT layer 4 is provided with a plurality of data lines DL extending in the column direction, and a plurality of scanning lines SC(n) and a plurality of light emission control lines EM(n) extending in the row direction. A subpixel SP is connected to the data line DL and the scanning line SC(n). Note that a high-level power source VDD and a low-level power source VSS for driving the organic EL element, and an initialization voltage Vini are supplied to the subpixels SP. During the period in which the scanning line SC(n) is active, a potential signal corresponding to display gray scale (data) is supplied to the subpixels connected thereto from the data line DL.

The subpixel SP includes a drive transistor Ta, a switch transistor Tb, a power supply control transistor Tc, a light emission control transistor Td, a threshold voltage compensation transistor Te, an initialization transistor Tf, and an electrostatic capacitance Cp, which are formed in the TFT layer 4 illustrated in FIG. 2, and a light-emitting element ES (an organic light-emitting diode, for example) including the light-emitting layer 24, which is formed in the light-emitting element layer 5 illustrated in FIG. 2.

The drive transistor Ta includes a gate electrode which is connected with a source electrode of the threshold voltage compensation transistor Te, a drain electrode of the initialization transistor Tf, and one electrode of the capacitor Cp, a drain electrode which is connected with a source electrode of the switch transistor Tb and a source electrode of the power supply control transistor Tc, and a source electrode which is connected with a drain electrode of the light emission control transistor Td and a drain electrode of the threshold voltage compensation transistor Te.

The switch transistor Tb includes a gate electrode connected to the scanning line SC(n) of the n-th row, a drain electrode connected to the data line DL, and the source electrode which is connected to the drain electrode of the drive transistor Ta and the source electrode of the power supply control transistor Tc. The power supply control transistor Tc includes a gate electrode connected to the light emission control line EM(n) of the n-th row, a drain electrode which is connected to the supply line of the high-level power source VDD and the other electrode of the capacitor Cp, and the source electrode which is connected to the drain electrode of the drive transistor Ta and the source electrode of the switch transistor Tb.

The anode electrode 22 of the light-emitting element ES is connected to the drain electrode of the light emission control transistor Td, and the cathode electrode 25 of the light-emitting element ES is connected to the supply line of the low-level power source VSS.

First Embodiment

In a case where a shape, a state, a size, and the like are specified in the following, the shape, the state, the size, and the like are not required to strictly match with those in the following. Even when those do not strictly match, the present embodiments encompass a range that achieves the object, the functions, the effects, and the like (the range that can be said as substantial match).

In the following, for ease of description, a transverse direction on the drawing sheet corresponds to a row direction, and a diagonal direction is relative to a row direction and a column direction (a vertical direction on the drawing sheet). Note that the row direction, for example, may have a parallel relationship, an orthogonal relationship, or a diagonal relationship with one edge (one side) of the display device.

Figure 3:
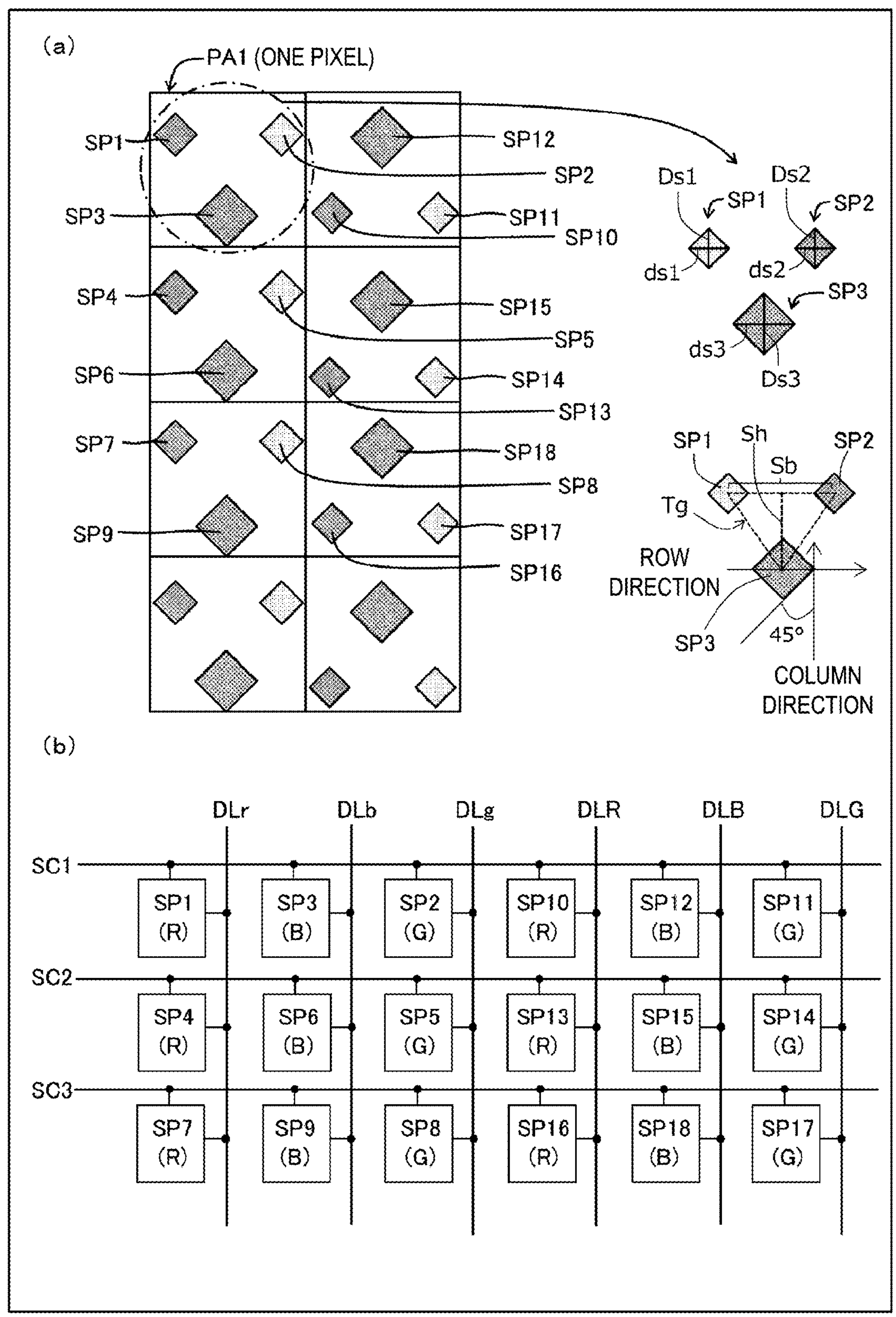
FIG. 3(*a*) is a schematic view illustrating arrangement of subpixels in a first embodiment, and FIG. 3(*b*) is a schematic view illustrating a connection relationship between the subpixels, scanning lines, and data lines.

FIG. 3(*a*) is a schematic view illustrating arrangement of subpixels in the first embodiment, and FIG. 3(*b*) is a schematic view illustrating a connection relationship between the subpixels, scanning lines, and data lines. In FIG. 3, an equivalent of three subpixels is included in one pixel area, and the SPR ratio being an input/output ratio of the subpixel is 1. The region PA1 (broken-line frame) in FIG. 3 corresponds to one pixel area. It is assumed that each of the subpixels has a configuration illustrated in FIG. 2, for example.

In the first embodiment, three subpixels SP1, SP4, and SP7 each including a red light-emitting layer and having the same shape are arrayed in the column direction, and are connected to the data line DLr. Three subpixels SP3, SP6, and SP9 each including a blue light-emitting layer and having the same shape are arrayed in the column direction, and are connected to the data line DLb. Three subpixels SP2, SP5, and SP8 each including a green light-emitting layer and having the same shape are arrayed in the column direction, and are connected to the data line DLg. Three subpixels SP10, SP13, and SP16 each including a red light-emitting layer and having the same shape are arrayed in the column direction, and are connected to a data line DLR. Three subpixels SP12, SP15, and SP18 each including a blue light-emitting layer and having the same shape are arrayed in the column direction, and are connected to the data line DLB. Three subpixels SP11, SP14, and SP17 each including a green light-emitting layer and having the same shape are arrayed in the column direction, and are connected to the data line DLG.

The subpixels SP1 and SP2 are adjacent to each other in the row direction, the subpixels SP3 and SP10 are adjacent to each other in the row direction, the subpixels SP4 and SP5 are adjacent to each other in the row direction, the subpixels SP6 and SP13 are adjacent to each other in the row direction, the subpixels SP7 and SP8 are adjacent to each other in the row direction, the subpixels SP9 and SP16 are adjacent to each other in the row direction, the subpixel SP3 is adjacent to the subpixels SP1, SP2, SP4, and SP5 in the diagonal direction, and the subpixel SP6 is adjacent to the subpixels SP4, SP5, SP7, and SP8 in the diagonal direction. In other words, the subpixels SP1, SP3, SP4, SP6, SP7, and SP9 are arranged in the stated order in a staggered manner, and the subpixels SP2, SP10, SP5, SP13, SP8, and SP16 are arranged in the stated order in a staggered manner.

FIG. 3 illustrates the first pixel (PA1) including the subpixel SP1, the subpixel SP2, and the subpixel SP3 and a second pixel adjacent to the first pixel in the row direction. The subpixel SP12, which is included in the second pixel and has the same color and shape as the subpixel SP3, the subpixel SP1, and the subpixel SP2 are arrayed in the row direction. The subpixel SP10, which is included in the second pixel and has the same color and shape as the subpixel SP1, the subpixel SP11, which is included in the second pixel and has the same color and shape as the subpixel SP2, and the subpixel SP3 are arrayed in the row direction.

The red subpixel, the green subpixel, and the blue subpixel have light-emitting regions that are geometrically similar to one another. The light-emitting regions of the red subpixel and the light-emitting region of the green subpixel are in the same size. The light-emitting region of the blue subpixel is in a size larger than those of the red subpixel and the green subpixel. As in FIG. 3(*a*), the light-emitting region of each of the subpixels SP1 to SP3 (first to third subpixels) has a square shape (regular rhombic shape) in which one of the diagonal lines (ds1, ds2, ds3) is parallel to the row direction and the other (Ds1, Ds2, Ds3) is parallel to the column direction. The subpixel SP3 (blue) has a light-emitting region larger than that of the subpixel SP1 (red) and the subpixel SP2 (green).

Each of the light-emitting regions of the subpixels SP1 to SP3 includes four sides forming an angle of 45 degrees with respect to the row direction or the column direction. Here, a triangle obtained by connecting light emission centroids of the subpixels SP1 to SP3 (centroids of the light-emitting regions) form an isosceles triangle Tg including a bottom line Sb parallel to the row direction, and a ratio of the bottom line Sb of the isosceles triangle Tg and a height Sh of the isosceles triangle Tg is 4:3.

The subpixels SP1, SP3, SP2, SP10, SP12, and SP11 are connected to the scanning line SC1, the subpixels SP4, SP6, SP5, SP13, SP15, and SP14 are connected to the scanning line SC2, and the subpixels SP7, SP9, SP8, SP16, SP18, and SP17 are connected to the scanning line SC3.

According to the configuration of FIG. 3, the red subpixel (SP1 and the like), the green subpixel (SP2 and the like), and the blue subpixel (SP3 and the like) have a geometrically similar shape (a rhombic shape obtained by tilting a square by 45 degrees), the red subpixel (SP1 and the like) and the green subpixel (SP2 and the like) have the same size, which is smaller than the size of the blue subpixel (SP3 and the like).

Figure 4:
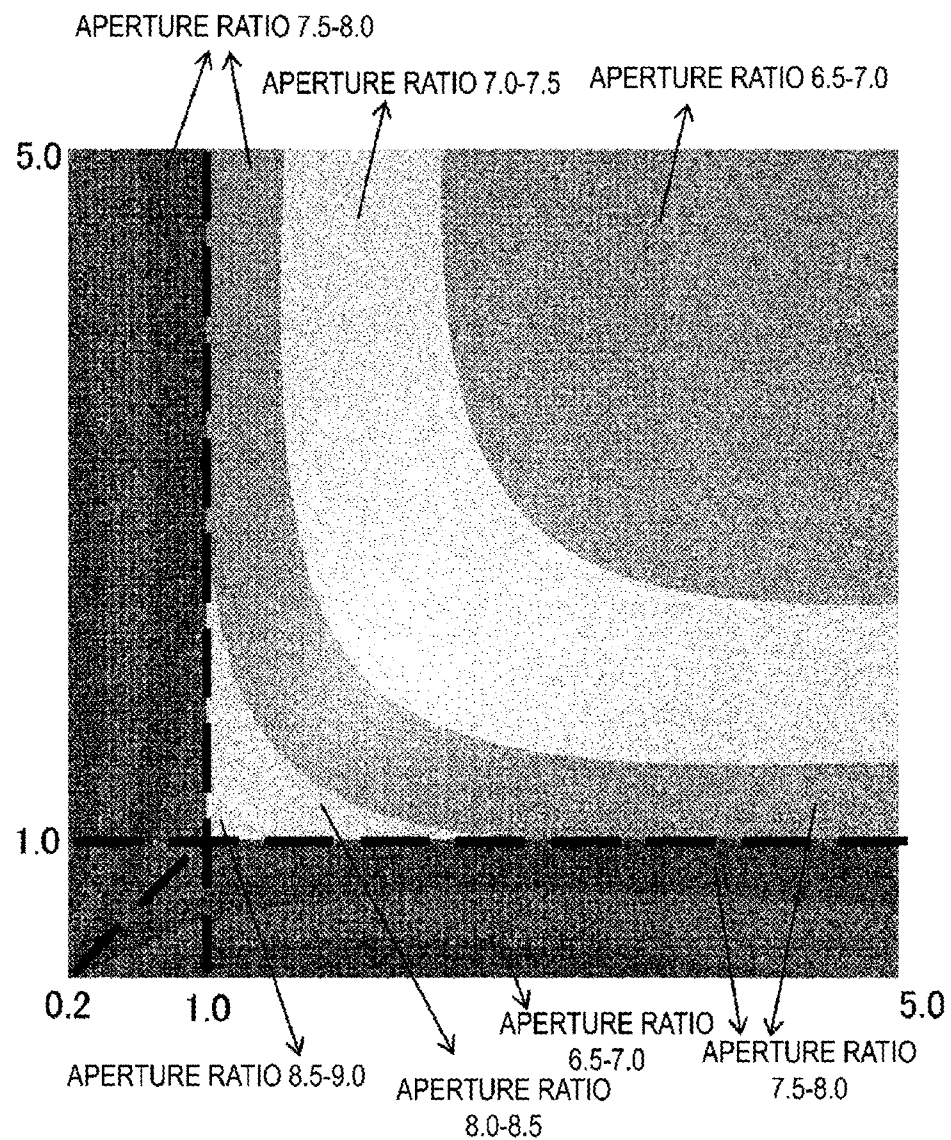
FIG. 4 is an explanatory view illustrating an advantage of the first embodiment.

Thus, a resolution can be increased while securing the pitch of the subpixels. Real display with delta arrangement (SPR ratio=1) as illustrated in FIG. 3(*a*) can be achieved. FIG. 4 is a graph illustrating a total opening (light-emitting region) ratio in a case where the subpixel SP1 to the subpixel SP3 have the geometrically similar light-emitting regions, the subpixel pitch is fixed, the size of the light-emitting region of the subpixel of a certain color is fixed (1.0), and the size of the light-emitting regions of the other two colors is varied in a range from 0.2 to 5.0. From FIG. 4, it is understood that, in a case where the size of the light-emitting region of one of the other two colors is increased to more than 1.0, the size of the other is fixed to 1.0, and thus the total aperture ratio is increased (the total light-emitting region is increased), which enables excellent display.

The data lines (DLr, DLb, DLg, and the like) are connected to the subpixels of the corresponding colors. Thus, a frequency of a potential signal to be supplied to the data lines can be suppressed low, and the charging rate of the capacitance Cp of the subpixel can be increased.

As illustrated in FIG. 3, by increasing the light-emitting region of the blue subpixel (SP3 and the like) in size, a service life of the blue subpixel, which is assumed to be shorter than those of the red and green subpixels, can be prolonged.

Second Embodiment

Figure 5:
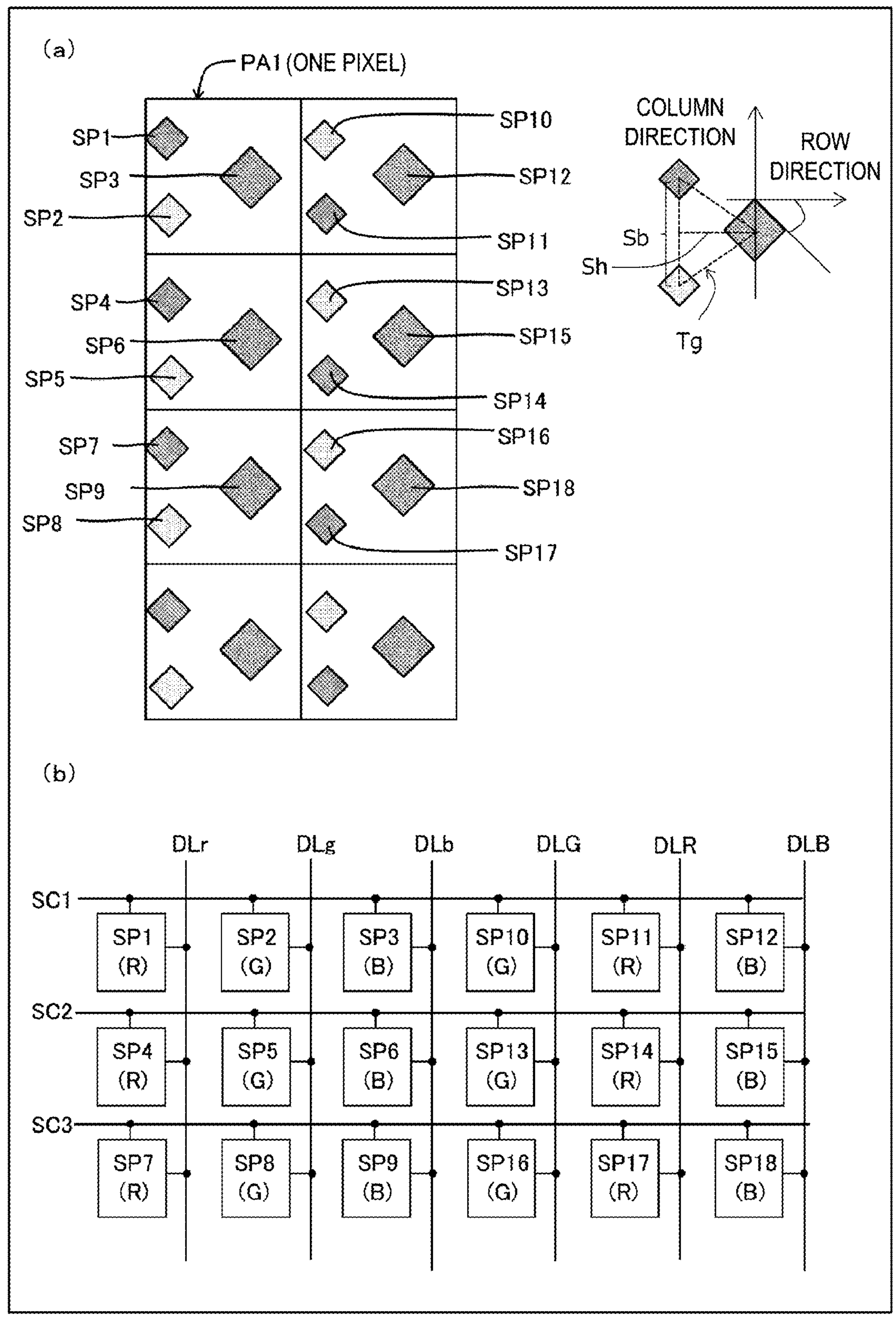
FIG. 5(*a*) is a schematic view illustrating arrangement of subpixels in a second embodiment, and FIG. 5(*b*) is a schematic view illustrating a connection relationship between the subpixels, scanning lines, and data lines.

FIG. 5(*a*) is a schematic view illustrating arrangement of subpixels in a second embodiment, and FIG. 5(*b*) is a schematic view illustrating a connection relationship between the subpixels, scanning lines, and data lines. In FIG. 5, an equivalent of three subpixels is included in one pixel area, and the SPR ratio being an input/output ratio of the subpixel is 1. The region PA1 (broken-line frame) in FIG. 5 corresponds to one pixel area. It is assumed that each of the subpixels has a configuration illustrated in FIG. 2, for example.

In FIG. 5, three subpixels SP1, SP4, and SP7 each including a red light-emitting layer and having the same shape are arrayed in the column direction, and are connected to the data line DLr. Three subpixels SP3, SP6, and SP9 each including a blue light-emitting layer and having the same shape are arrayed in the column direction, and are connected to the data line DLb. Three subpixels SP2, SP5, and SP8 each including a green light-emitting layer and having the same shape are arrayed in the column direction, and are connected to the data line DLg. Three subpixels SP10, SP13, and SP16 each including a green light-emitting layer and having the same shape are arrayed in the column direction, and are connected to a data line DLG. Three subpixels SP11, SP14, and SP17 each including a red light-emitting layer and having the same shape are arrayed in the column direction, and are connected to the data line DLR. Three subpixels SP12, SP15, and SP18 each including a blue light-emitting layer and having the same shape are arrayed in the column direction, and are connected to the data line DLB.

The subpixels SP1, SP2, SP4, SP5, SP7, and SP8 are arrayed in the same line in the stated order, the subpixels SP10, SP11, SP13, SP14, SP16, and SP17 are arrayed in the same line in the stated order, the subpixel SP3 is adjacent to the subpixels SP1, SP2, SP10, and SP11 in the diagonal direction, the subpixel SP6 is adjacent to the subpixels SP4, SP5, SP13, and SP14 in the diagonal direction, and the subpixel SP9 is adjacent to the subpixels SP7, SP8, SP16, and SP17 in the diagonal direction.

The red subpixel, the green subpixel, and the blue subpixel have light-emitting regions that are geometrically similar to one another. The light-emitting regions of the red subpixel and the light-emitting region of the green subpixel are in the same size. The light-emitting region of the blue subpixel is in a size larger than those of the red subpixel and the green subpixel. For example, the light-emitting region of each of the subpixels SP1 to SP3 (first to third subpixels) has a square shape (regular rhombic shape) in which one of the diagonal lines is parallel to the row direction and the other is parallel to the column direction. The subpixel SP3 (blue) has a light-emitting region larger than that of the subpixel SP1 (red) and the subpixel SP2 (green).

Each of the light-emitting regions of the subpixels SP1 to SP3 includes four sides forming an angle of 45 degrees with respect to the row direction or the column direction. Here, a triangle obtained by connecting light emission centroids of the subpixels SP1 to SP3 (centroids of the light-emitting regions) form an isosceles triangle Tg including a bottom line Sb vertical to the row direction, and a ratio of the bottom line Sb of the isosceles triangle Tg and a height Sh of the isosceles triangle Tg is 4:3.

The subpixels SP1, SP2, SP3, SP10, SP11, and SP12 are connected to the scanning line SC1, the subpixels SP4, SP5, SP6, SP13, SP14, and SP15 are connected to the scanning line SC2, and the subpixels SP7, SP8, SP9, SP16, SP17, and SP18 are connected to the scanning line SC3.

According to the configuration of FIG. 5, the red subpixel (SP1 and the like), the green subpixel (SP2 and the like), and the blue subpixel (SP3 and the like) have a geometrically similar shape (a rhombic shape obtained by tilting a square by 45 degrees), the red subpixel (SP1 and the like) and the green subpixel (SP2 and the like) have the same size, which is smaller than the size of the blue subpixel (SP3 and the like). Thus, a resolution can be increased while securing the pitch of the subpixels. Real display with delta arrangement (SPR ratio=1) as illustrated in FIG. 5(*a*) can be achieved.

The data lines (DLr, DLb, DLg, and the like) are connected to the subpixels of the corresponding colors. Thus, a frequency of a potential signal to be supplied to the data lines can be suppressed low, and the charging rate of the capacitance Cp of the subpixel can be increased.

As illustrated in FIG. 5, by increasing the light-emitting region of the blue subpixel (SP3 and the like) in size, a service life of the blue subpixel, which is assumed to be shorter than those of the red and green subpixels, can be prolonged.

Third Embodiment

Figure 6:
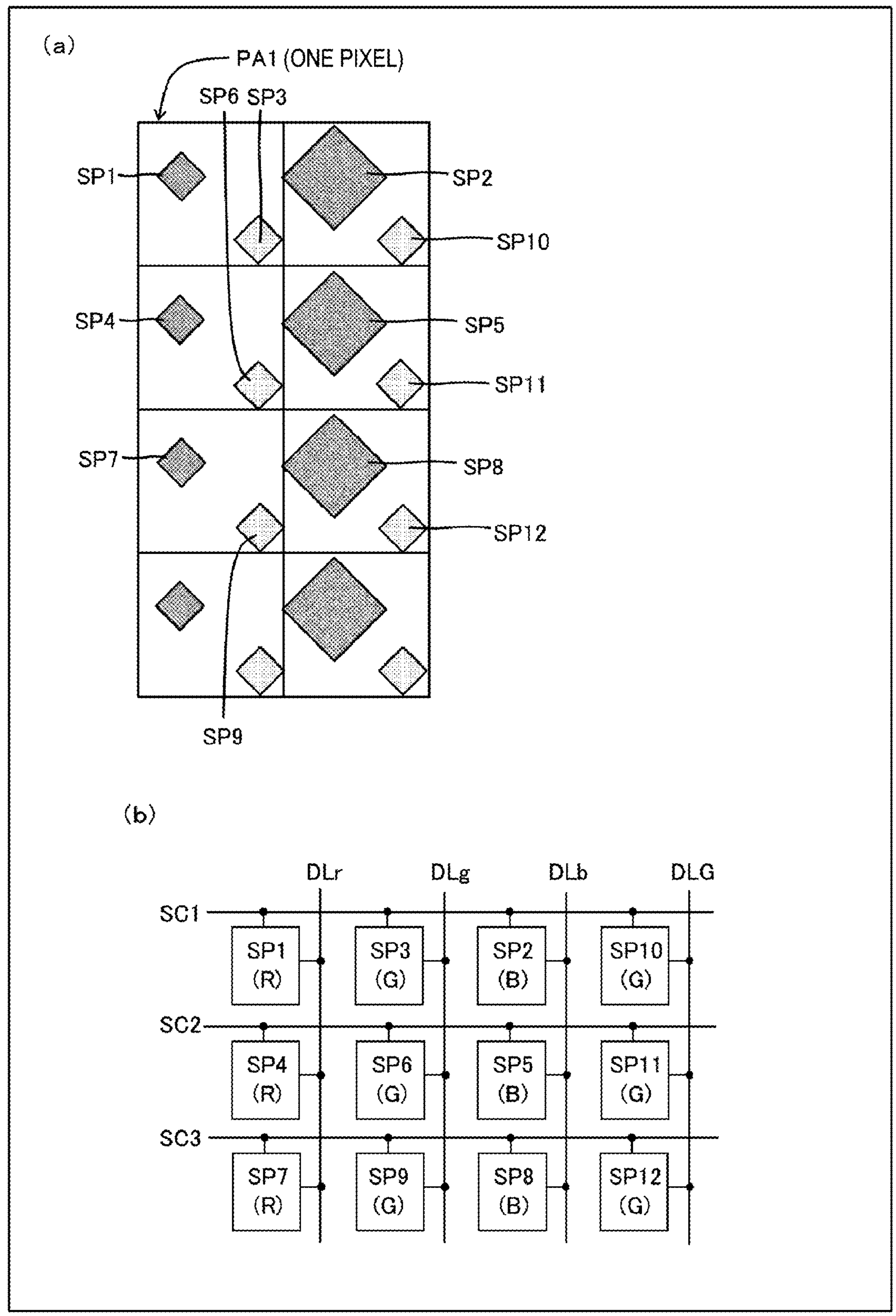
FIG. 6(*a*) is a schematic view illustrating arrangement of subpixels in a third embodiment, and FIG. 6(*b*) is a schematic view illustrating a connection relationship between the subpixels, scanning lines, and data lines.

FIG. 6(*a*) is a schematic view illustrating arrangement of subpixels in a third embodiment, and FIG. 6(*b*) is a schematic view illustrating a connection relationship between the subpixels, scanning lines, and data lines. In FIG. 6, an equivalent of two subpixels is included in one pixel area, and the SPR ratio being an input/output ratio of the subpixel is ⅔. The region PA1 (broken-line frame) in FIG. 6 corresponds to one pixel area. It is assumed that each of the subpixels has a configuration illustrated in FIG. 2, for example.

In FIG. 6, three subpixels SP1, SP4, and SP7 each including a red light-emitting layer and having the same shape are arrayed in the column direction, and are connected to the data line DLr. Three subpixels SP3, SP6, and SP9 each including a green light-emitting layer and having the same shape are arrayed in the column direction, and are connected to the data line DLg. Three subpixels SP2, SP5, and SP8 each including a blue light-emitting layer and having the same shape are arrayed in the column direction, and are connected to the data line DLb. Three subpixels SP10, SP11, and SP12 each including a green light-emitting layer and having the same shape are arrayed in the column direction, and are connected to the data line DLG.

The subpixels SP1 and SP2 are adjacent to each other in the row direction, the subpixels SP3 and SP10 are adjacent to each other in the row direction, the subpixels SP4 and SP5 are adjacent to each other in the row direction, the subpixels SP6 and SP11 are adjacent to each other in the row direction, the subpixels SP7 and SP8 are adjacent to each other in the row direction, the subpixels SP9 and SP12 are adjacent to each other in the row direction, the subpixel SP3 is adjacent to the subpixels SP1, SP2, SP4, and SP5 in the diagonal direction, and the subpixel SP6 is adjacent to the subpixels SP4, SP5, SP7, and SP8 in the diagonal direction. In other words, the subpixel SP1, SP3, SP4, SP6, SP7, SP9 are arranged in the stated order in a staggered manner, and the subpixel SP2, SP10, SP5, SP11, SP8, SP12 are arranged in the stated order in a staggered manner.

The red subpixel, the green subpixel, and the blue subpixel have light-emitting regions that are geometrically similar to one another. The light-emitting regions of the red subpixel and the light-emitting region of the green subpixel are in the same size. The light-emitting region of the blue subpixel is in a size larger than those of the red subpixel and the green subpixel. For example, the light-emitting region of each of the subpixels SP1 to SP3 (first to third subpixels) has a square shape (regular rhombic shape) in which one of the diagonal lines is parallel to the row direction and the other is parallel to the column direction. The subpixel SP2 (blue) has a light-emitting region larger than that of the subpixel SP1 (red) and the subpixel SP3 (green).

In this case, the subpixel SP1, SP3, SP2, SP10 are connected to the scanning line SC1, the subpixels SP4, SP6, SP5, and SP11 are connected to the scanning line SC2, and the subpixel SP7, SP9, SP8, SP12 are connected to the scanning line SC3.

According to the configuration of FIG. 6, the red subpixel (SP1 and the like), the green subpixel (SP2 and the like), and the blue subpixel (SP3 and the like) have a geometrically similar shape (a rhombic shape obtained by tilting a square by 45 degrees), the red subpixel (SP1 and the like) and the green subpixel (SP2 and the like) have the same size, which is smaller than the size of the blue subpixel (SP3 and the like). Thus, a resolution can be improved while securing the pitch of the subpixels.

The data lines (DLr, DLb, DLg, and the like) are connected to the subpixels of the corresponding colors. Thus, a frequency of a potential signal to be supplied to the data lines can be suppressed low, and the charging rate of the capacitance Cp of the subpixel can be increased.

As illustrated in FIG. 6, by increasing the light-emitting region of the blue subpixel (SP2 and the like) in size, a service life of the blue subpixel, which is assumed to be shorter than those of the red and green subpixels, can be prolonged.

Fourth Embodiment

Figure 7:
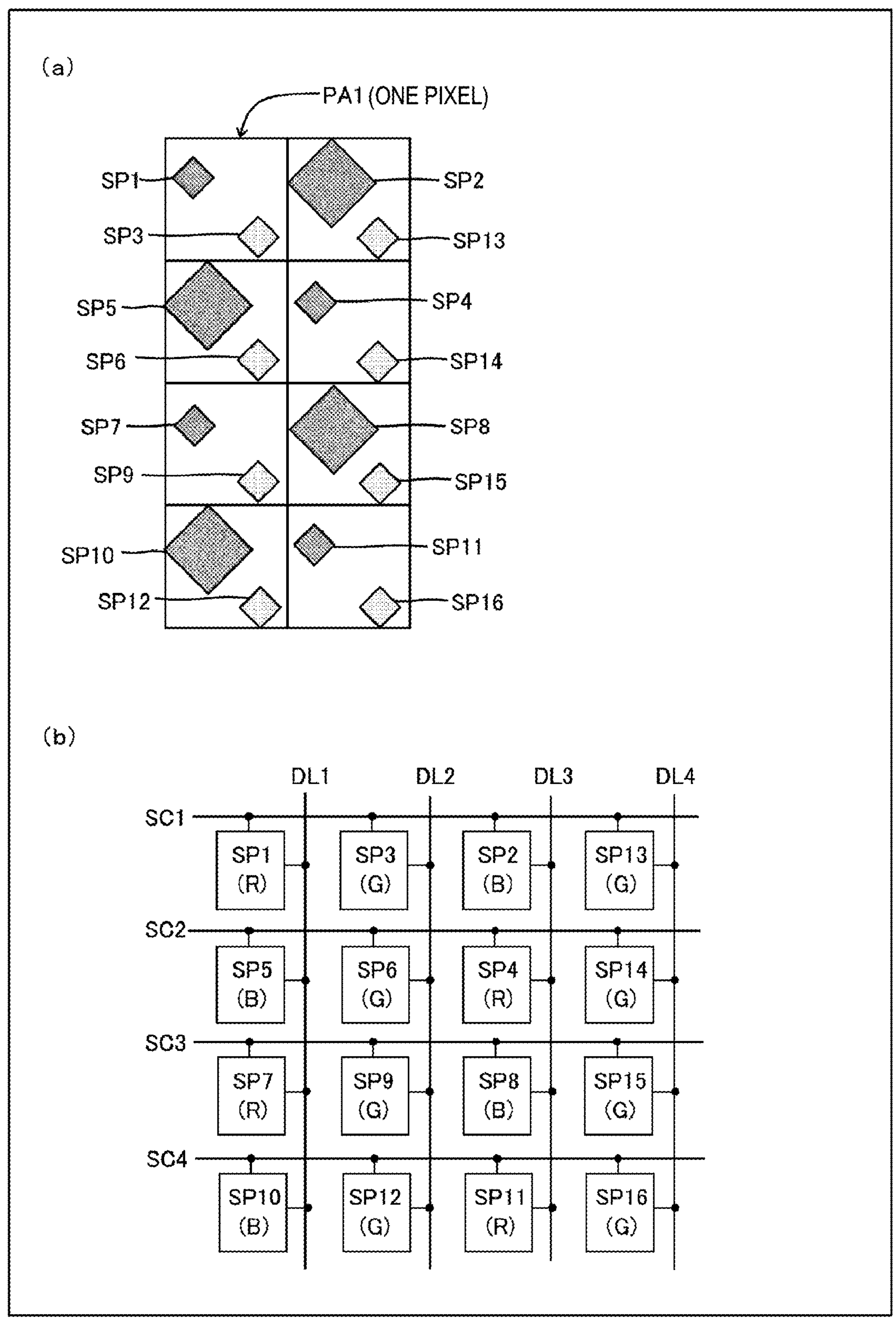
FIG. 7(*a*) is a schematic view illustrating arrangement of subpixels in a fourth embodiment, and FIG. 7(*b*) is a schematic view illustrating a connection relationship between the subpixels, scanning lines, and data lines.

FIG. 7(*a*) is a schematic view illustrating arrangement of subpixels in a fourth embodiment, and FIG. 7(*b*) is a schematic view illustrating a connection relationship between the subpixels, scanning lines, and data lines. In FIG. 7, an equivalent of two subpixels is included in one pixel area, and the SPR ratio being an input/output ratio of the subpixel is ⅔. Note that the region PA1 (broken-line frame) in FIG. 7 corresponds to one pixel area. It is assumed that each of the subpixels has a configuration illustrated in FIG. 2, for example.

In FIG. 7, two subpixels SP1 and SP7 each including a red light-emitting layer and having the same shape and two subpixels SP5 and SP10 each including a blue light-emitting layer and having the same shape are arrayed in the order of the subpixels SP1, SP5, SP7, and SP10 in the column direction, and are connected to a data line DLl Four subpixels SP3, SP6, SP9, and SP12 each including a green light-emitting layer and having the same shape are arrayed in the stated order in the column direction, and are connected to a data line DL2. Two subpixels SP2 and SP8 each including a blue light-emitting layer and having the same shape and two subpixels SP4 and SP11 each including a red light-emitting layer and having the same shape are arrayed in the order of the subpixels SP2, SP4, SP8, and SP11 in the column direction, and are connected to a data line DL3. Four subpixels SP13, SP14, SP15, and SP16 each including a green light-emitting layer and having the same shape are arrayed in the stated order in the column direction, and are connected to a data line DL4.

The subpixels SP1 and SP2 are adjacent to each other in the row direction, the subpixels SP3 and SP13 are adjacent to each other in the row direction, the subpixels SP4 and SP5 are adjacent to each other in the row direction, the subpixels SP6 and SP14 are adjacent to each other in the row direction, the subpixels SP7 and SP8 are adjacent to each other in the row direction, the subpixels SP9 and SP15 are adjacent to each other in the row direction, the subpixels SP10 and SP11 are adjacent to each other in the row direction, the subpixels SP12 and SP16 are adjacent to each other in the row direction, the subpixel SP3 is adjacent to the subpixels SP1, SP2, SP4, and SP5 in the diagonal direction, the subpixel SP6 is adjacent to the subpixels SP4, SP5, SP7, and SP8 in the diagonal direction, and the subpixel SP9 is adjacent to the subpixels SP7, SP8, SP10, and SP11 in the column direction. In other words, the subpixels SP1, SP3, SP5, SP6, SP7, SP9, SP10, and SP12 are arranged in the stated order in a staggered manner, and the subpixels SP2, SP13, SP4, SP14, SP8, SP15, SP11, and SP16 are arranged in the stated order in a staggered manner.

The red subpixel, the green subpixel, and the blue subpixel have light-emitting regions that are geometrically similar to one another. The light-emitting regions of the red subpixel and the light-emitting region of the green subpixel are in the same size. The light-emitting region of the blue subpixel is in a size larger than those of the red subpixel and the green subpixel. For example, the light-emitting region of each of the subpixels SP1 to SP3 (first to third subpixels) has a square shape (regular rhombic shape) in which one of the diagonal lines is parallel to the row direction and the other is parallel to the column direction. The subpixel SP2 (blue) has a light-emitting region larger than that of the subpixel SP1 (red) and the subpixel SP3 (green).

In this case, the subpixels SP1, SP3, SP2, and SP13 are connected to the scanning line SC1, the subpixels SP5, SP6, SP4, and SP14 are connected to the scanning line SC2, and the subpixels SP7, SP9, SP8, and SP15 are connected to the scanning line SC3.

According to the configuration of FIG. 7, the red subpixel (SP1 and the like), the green subpixel (SP2 and the like), and the blue subpixel (SP3 and the like) have a geometrically similar shape (a rhombic shape obtained by tilting a square by 45 degrees), the red subpixel (SP1 and the like) and the green subpixel (SP2 and the like) have the same size, which is smaller than the size of the blue subpixel (SP3 and the like). Thus, a resolution can be improved while securing the pitch of the subpixels.

As illustrated in FIG. 7, by increasing the light-emitting region of the blue subpixel (SP2 and the like) in size, a service life of the blue subpixel, which is assumed to be shorter than those of the red and green subpixels, can be prolonged.

Supplement

An electro-optical element (an electro-optical element whose luminance and transmittance are controlled by an electric current) that is provided in a display device according to the present embodiment is not particularly limited thereto. Examples of the display device according to the present embodiment include an organic Electro Luminescence (EL) display provided with the Organic Light Emitting Diode (OLED) as the electro-optical element, an inorganic EL display provided with an inorganic light emitting diode as the electro-optical element, and a Quantum dot Light Emitting Diode (QLED) display provided with a QLED as the electro-optical element.

The disclosure is not limited to the embodiments stated above. Embodiments obtained by appropriately combining technical approaches stated in each of the different embodiments also fall within the scope of the technology of the disclosure. Moreover, novel technical features can be formed by combining the technical approaches disclosed in the embodiments.

First Aspect

A display device including: a first subpixel including a light-emitting layer of a first color; a second subpixel adjacent to the first subpixel in a row direction or a column direction, the second subpixel including a light-emitting layer of a second color; and a third subpixel adjacent to the first subpixel and the second subpixel in a diagonal direction, the third subpixel including a light-emitting layer of a third color, wherein the first subpixel to the third subpixel include light-emitting regions that are geometrically similar to one another, the light-emitting regions of two of the first subpixel to the third subpixel are in the same size, and a light-emitting region of remaining one of the first subpixel to the third subpixel is larger than the light-emitting regions of the two of the first subpixel to the third subpixel.

Second Aspect

The display device, for example, according to the first aspect, wherein each of the light-emitting regions of the first subpixel to the third subpixel has a square shape in which one of two diagonal lines is parallel to the row direction and the other one is parallel to the column direction.

Third Aspect

The display device, for example, according to the first aspect or the second aspect, wherein a light-emitting region of the third subpixel is larger than the light-emitting regions of the first subpixel and the second subpixel.

Fourth Aspect

The display device, for example, according to any one of the first aspect to the third aspect, wherein a triangle obtained by connecting a centroid of the light-emitting region of the first subpixel, a centroid of the light-emitting region of the second subpixel, and a centroid of the light-emitting region of the third subpixel is an isosceles triangle having a bottom line being a line connecting the centroid of the light-emitting region of the first subpixel and the centroid of the light-emitting region of the second subpixel.

Fifth Aspect

The display device, for example, according to the fourth aspect, wherein a ratio of the bottom line and a height of the isosceles triangle is 4:3.

Sixth Aspect

The display device, for example according to any one of the first aspect to the fifth aspect wherein the first subpixel, the second subpixel, and the third subpixel are connected to the same scanning line.

Seventh Aspect

The display device, for example, according to any one of the first aspect to the sixth aspect, further including a fourth subpixel including a light-emitting layer of the first color and having the same shape as the first subpixel; a fifth subpixel including a light-emitting layer of the second color and having the same shape as the second subpixel; and a sixth subpixel including a light-emitting layer of the third color and having the same shape as the third subpixel.

Eighth Aspect

The display device, for example, according to the seventh aspect, wherein the third subpixel and the sixth subpixel are arrayed in the column direction.

Ninth Aspect

The display device, for example, according to the seventh aspect, further including a plurality of data lines, wherein the plurality of data lines are connected to the subpixels including the light-emitting layers of corresponding colors.

Tenth Aspect

The display device, for example according to the seventh aspect, further including a plurality of data lines, wherein the first subpixel and the fifth subpixel are connected to one data line, and the third subpixel and the sixth subpixel are connected to another data line.

Eleventh Aspect

The display device, for example, according to the first aspect, further including: a first pixel including the first subpixel, the second subpixel, and the third subpixel; and a second pixel adjacent to the first pixel in the row direction, wherein a subpixel being included in the second pixel and having the same shape as the third subpixel, the first subpixel, and the second subpixel are arrayed in the row direction, and a subpixel being included in the second pixel and having the same shape as the first subpixel, a subpixel being included in the second pixel and having the same shape as the second subpixel, and the third subpixel are arrayed in the row direction.

Twelfth Aspect

The display device, for example, according to the ninth aspect or the tenth aspect, wherein each of the plurality of data lines has a linear shape extending in the column direction.

Thirteenth Aspect

The display device, for example according to any one of the first aspect to the twelfth aspect, wherein an equivalent of three subpixels is included in one pixel area.

Fourteenth Aspect

The display device, for example according to any one of the first aspect to the twelfth aspect, wherein an equivalent of two subpixels is included in one pixel area.

Fifteenth Aspect

The display device, for example according to the thirteenth aspect, wherein one of the first color and the second color is red, the other one of the first color and the second color is green, and the third color is blue.

Sixteenth Aspect

The display device, for example according to the fourteenth aspect, wherein one of the first color and the third color is red, the other one of the first color and the third color is green, and the second color is blue.

Seventeenth Aspect

The display device, for example according to any one of the first aspect to the sixteenth aspect, wherein the light-emitting layer includes an organic EL layer.

Eighteenth Aspect

The display device, for example according to any one of the first aspect to the sixteenth aspect, wherein the light-emitting layer is a quantum dot layer.

REFERENCE SIGNS LIST

2 Display device
4 TFT layer
5 Light-emitting element layer
6 Sealing layer
10 Lower face film
12 Resin layer
21 Flattening film
22 Anode electrode
24 Light-emitting layer
25 Cathode electrode
NA Non-active area
DA Active area
SP1 to SP3 Subpixel (first to third subpixels)
DLr, DLg, DLb Data line

The invention claimed is:

1. A display device comprising:

a first subpixel including a light-emitting layer of a first color;

a second subpixel adjacent to the first subpixel in a row direction or a column direction, the second subpixel including a light-emitting layer of a second color; and a third subpixel adjacent to the first subpixel and the second subpixel in a diagonal direction, the third subpixel including a light-emitting layer of a third color, wherein the display device further includes:

a fourth subpixel including a light-emitting layer of the first color and adjacent to the first subpixel in the column direction;

a fifth subpixel including a light-emitting layer of the second color and adjacent to the second subpixel in the column direction;

a sixth subpixel including a light-emitting layer of the third color and adjacent to the third subpixel in the column direction; and a seventh subpixel including a light-emitting layer of the first color and adjacent to the third subpixel in the row direction, a first triangle obtained by connecting a centroid of the light-emitting region of the first subpixel, a centroid of the light-emitting region of the second subpixel, and a centroid of the light-emitting region of the third subpixel is an isosceles triangle having a bottom line being a line connecting the centroid of the light-emitting region of the first subpixel and the centroid of the light-emitting region of the second subpixel, a second triangle obtained by connecting a centroid of the light-emitting region of the fourth subpixel, a centroid of the light-emitting region of the fifth subpixel, and a centroid of the light-emitting region of the sixth subpixel is an isosceles triangle having a bottom line being a line connecting the centroid of the light-emitting region of the fourth subpixel and the centroid of the light-emitting region of the fifth subpixel, a third triangle obtained by connecting the centroid of the light-emitting region of the third subpixel, the centroid of the light-emitting region of the fourth subpixel, and the centroid of the light-emitting region of the fifth subpixel is an isosceles triangle having a bottom line being a line connecting the centroid of the light-emitting region of the fourth subpixel and the centroid of the light-emitting region of the fifth subpixel, a fourth triangle obtained by connecting the centroid of the light-emitting region of the second subpixel, the centroid of the light-emitting region of the third subpixel, and a centroid of the light-emitting region of the seventh subpixel is an isosceles triangle having a bottom line being a line connecting the centroid of the light-emitting region of the third subpixel and the centroid of the light-emitting region of the seventh subpixel, a ratio of the bottom line and a height of the first triangle, the second triangle, the third triangle, and the fourth triangle is 4:3, a first one of two diagonal lines of each of the first subpixel, the second subpixel, the third subpixel, the fourth subpixel, the fifth subpixel, the sixth subpixel, and the seventh subpixel is parallel to a row direction and a second one of the two diagonal lines is parallel to a column direction, and the first subpixel, the second subpixel, the third subpixel, the fourth subpixel, the fifth subpixel, the sixth subpixel, and the seventh subpixel are squares.

2. The display device according to claim 1, wherein each of the light-emitting regions of the first subpixel to the third subpixel has a square shape in which one of two diagonal lines is parallel to the row direction and the other one is parallel to the column direction.

3. The display device according to claim 1, wherein a light-emitting region of the third subpixel is larger than the light-emitting regions of the first subpixel and the second subpixel.

4. The display device according to claim 1, wherein the first subpixel, the second subpixel, and the third subpixel are connected to the same scanning line.

5. The display device according to claim 1, comprising:

a first pixel including the first subpixel, the second subpixel, and the third subpixel; and a second pixel adjacent to the first pixel in the row direction, wherein a subpixel being included in the second pixel and having the same shape as the third subpixel, the first subpixel, and the second subpixel are arrayed in the row direction, and a subpixel being included in the second pixel and having the same shape as the first subpixel, a subpixel being included in the second pixel and having the same shape as the second subpixel, and the third subpixel are arrayed in the row direction.

6. The display device according to claim 1, wherein each of the plurality of data lines has a linear shape extending in the column direction.

7. The display device according to claim 1, wherein an equivalent of three subpixels is included in one pixel area.

8. The display device according to claim 1, wherein an equivalent of two subpixels is included in one pixel area.

9. The display device according to claim 7, wherein one of the first color and the second color is red, the other one of the first color and the second color is green, and the third color is blue.

10. The display device according to claim 8, wherein one of the first color and the third color is red, the other one of the first color and the third color is green, and the second color is blue.

11. The display device according to claim 1, wherein the light-emitting layer is an organic EL layer.

12. The display device according to claim 1, wherein the light-emitting layer is a quantum dot layer.

13. The display device according to claim 1, wherein:

the fourth subpixel has the same shape as the first subpixel, the fifth subpixel has the same shape as the second subpixel, and the sixth subpixel has the same shape as the third subpixel.

14. The display device according to claim 13, wherein the third subpixel and the sixth subpixel are arrayed in the column direction.

15. The display device according to claim 13, further comprising:

a plurality of data lines, wherein the plurality of data lines are connected to the subpixels including the light-emitting layers of corresponding colors.

16. The display device according to claim 13, further comprising:

a plurality of data lines, wherein the first subpixel and the fifth subpixel are connected to one data line, and the third subpixel and the sixth subpixel are connected to another data line.

17. The display device according to claim 1, wherein the first subpixel to the third subpixel include light-emitting regions that are geometrically similar to one another, the light-emitting regions of two of the first subpixel to the third subpixel are in the same size, and a light-emitting region of remaining one of the first subpixel to the third subpixel is larger than the light-emitting regions of the two of the first subpixel to the third subpixel.

* * * * *